(12) United States Patent
Ammar

(10) Patent No.: US 7,199,570 B2
(45) Date of Patent: Apr. 3, 2007

(54) MULTI-CHANNEL RADIOMETER IMAGING SYSTEM

(75) Inventor: Danny F. Ammar, Windermere, FL (US)

(73) Assignee: Xytrans, Inc., Orlando, FL (US)

( * ) Notice: Subject to any disclaimer, the term of this patent is extended or adjusted under 35 U.S.C. 154(b) by 0 days.

(21) Appl. No.: 11/280,003

(22) Filed: Nov. 16, 2005

(65) Prior Publication Data

US 2007/0024268 A1      Feb. 1, 2007

Related U.S. Application Data

(63) Continuation of application No. 10/995,952, filed on Nov. 23, 2004, which is a continuation-in-part of application No. 10/847,892, filed on May 18, 2004.

(60) Provisional application No. 60/504,182, filed on Sep. 18, 2003.

(51) Int. Cl.
*G01S 3/02* (2006.01)
*G01R 23/02* (2006.01)

(52) U.S. Cl. .................... 324/76.14; 342/351; 250/250

(58) Field of Classification Search ............. 324/76.14, 324/76.13, 76.12, 76.11; 342/351; 343/703; 374/120–122; 250/250
See application file for complete search history.

(56) References Cited

U.S. PATENT DOCUMENTS

| | | | |
|---|---|---|---|
| 3,693,095 A | 9/1972 | Wilt | 324/363 |
| 3,725,930 A | 4/1973 | Caruso, Jr. | 343/100 |
| 3,777,270 A | 12/1973 | Hardy et al. | 325/363 |
| 4,521,861 A | 6/1985 | Logan et al. | 364/517 |
| 4,557,272 A | 12/1985 | Carr | 128/736 |
| 4,724,439 A | 2/1988 | Wiley et al. | 342/351 |
| RE33,791 E | 1/1992 | Carr | 374/122 |
| 5,149,198 A | 9/1992 | Sterzer | 374/139 |
| 5,170,126 A * | 12/1992 | Wedge et al. | 324/613 |
| 5,198,776 A | 3/1993 | Carr | 324/639 |
| 5,202,692 A | 4/1993 | Huguenin et al. | 342/179 |
| 5,239,685 A | 8/1993 | Moe et al. | 455/73 |
| 5,248,977 A | 9/1993 | Lee et al. | 342/25 |
| 5,434,575 A * | 7/1995 | Jelinek et al. | 342/365 |

(Continued)

FOREIGN PATENT DOCUMENTS

GB      2 211 952      7/1989

OTHER PUBLICATIONS

Nakano, et al., "*A Broadband Microwave Radiometer Using Correlation Technique*," IEEE Transactions on Instrumentation and Measurement, IEEE Inc., vol. 48, No. 2, Apr. 1999, pp. 631-633.

*Primary Examiner*—Andrew H. Hirshfeld
*Assistant Examiner*—Hoai-An D. Nguyen
(74) *Attorney, Agent, or Firm*—Allen, Dyer, Doppelt, Milbrath & Gilchrist, P.A.

(57) ABSTRACT

A radiometer includes a housing and an RF board carried by the housing. A hybrid and amplifier circuit receives an unknown signal and a known reference signal. A switch receives signals as inputs from the hybrid and amplifier circuit and switches between the inputs. A detection circuit receives and detects the signal from the switch forming a detected signal. A controller board is carried by the housing and an integration circuit and processor receive the detected signal and produces a digital output.

6 Claims, 12 Drawing Sheets

U.S. PATENT DOCUMENTS

| | | | |
|---|---|---|---|
| 5,438,336 A | 8/1995 | Lee et al. | 342/174 |
| 5,815,113 A | 9/1998 | Lo et al. | 342/351 |
| 5,949,845 A | 9/1999 | Sterzer | 378/37 |
| 5,999,121 A | 12/1999 | Salonen | 342/351 |
| 6,052,024 A | 4/2000 | Lo et al. | 330/53 |
| 6,414,606 B1 | 7/2002 | Yujiri et al. | 340/901 |
| 6,439,763 B2 | 8/2002 | Roeder et al. | 374/1 |
| 6,647,350 B1 | 11/2003 | Palfenier et al. | 702/134 |
| 6,803,838 B2 * | 10/2004 | Hoyland | 333/156 |
| 6,812,824 B1 * | 11/2004 | Goldinger et al. | 340/10.1 |
| 6,844,715 B2 | 1/2005 | Hoffmann | 324/76.13 |
| 2003/0025486 A1 | 2/2003 | Ellis et al. | 324/76.14 |
| 2004/0057496 A1 | 3/2004 | Roeder | 374/129 |
| 2004/0066327 A1 | 4/2004 | Salmon | 342/351 |
| 2006/0006986 A1 * | 1/2006 | Gravelle et al. | 340/10.3 |

* cited by examiner

NOISE BW (MHZ) = 20000
TEMP (DEG K)    300
INTEG. TIME (SEC) 0.010

| COMMENT | AMBIENT | ANTENNA | MANIFOLD INTERFACE | WGT | SWITCH | LNA | LNA | LNA | FILTER | DETECTOR |
|---|---|---|---|---|---|---|---|---|---|---|
| GAIN/LOSS (DB) |  | -2.00 | -2.00 | -1.00 | -2.00 | 17.00 | 17.00 | 17.00 | -5.00 | 0.00 |
| NOISE FIGURE (DB) |  | 2.00 | 2.00 | 1.00 | 2.00 | 5.00 | 5.00 | 5.00 | 5.00 | 0.00 |
| NOISE TEMP | 300 | 169.6 | 169.6 | 75.1 | 169.6 | 627.1 | 627.1 | 627.1 | 627.1 | 0.0 |
| CUM GAIN |  | -2 | -4.00 | -5.00 | -7.00 | 10.00 | 27.00 | 44.00 | 39.00 | 39.00 |
| CUM NF |  | 2 | 4.0 | 5.0 | 7.0 | 12.0 | 12.1 | 12.1 | 12.1 | 12.1 |
| CUM TEMP | 300.0 | 469.6 | 438.4 | 627.1 | 1163.4 | 4306.3 | 4369.0 | 4370.3 | 4370.3 | 4370.3 |

SENSITIVITY (DEG K)  0.6

FIG. 10

NOISE BW (MHZ) = 20000
TEMP (DEG K)    300
INTEG. TIME (SEC) 0.010

| COMMENT | AMBIENT | ANTENNA | WGT REF | HYBRID | LNA | MICROSTRIP | LNA | MICROSTRIP | LNA | FILTER | DETECTOR |
|---|---|---|---|---|---|---|---|---|---|---|---|
| GAIN/LOSS (DB) |  | -2.00 | -0.70 | -0.70 | 17.00 | -0.70 | 17.00 | -0.70 | 17.00 | -5.00 | 0.00 |
| NOISE FIGURE (DB) |  | 2.00 | 0.70 | 0.70 | 5.00 | 0.70 | 5.00 | 0.70 | 5.00 | 5.00 | 0.00 |
| NOISE TEMP | 300 | 169.6 | 50.7 | 50.7 | 627.1 | 50.7 | 627.1 | 50.7 | 627.1 | 627.1 | 0.0 |
| CUM GAIN |  | -2 | -2.70 | -3.40 | 13.60 | 12.90 | 29.90 | 29.20 | 46.20 | 41.20 | 41.20 |
| CUM NF |  | 2 | 2.7 | 3.4 | 8.4 | 8.4 | 8.5 | 8.5 | 8.5 | 8.5 | 8.5 |
| CUM TEMP | 300.0 | 469.6 | 250.0 | 344.5 | 1716.4 | 1718.6 | 1750.7 | 1750.8 | 1751.5 | 1751.6 | 1751.6 |

SENSITIVITY (DEG K)  0.12

FIG. 11

| DICKE | AMBIENT | HORN ▷ | WGT ⊢WGT⊣ | SWITCH | LNA ▷ | LNA ▷ | FILTER | LNA ▷ | DETECTOR ▷ |
|---|---|---|---|---|---|---|---|---|---|
| GAIN/LOSS (DB) | | -0.30 | -0.70 | -2.00 | 16.00 | 16.00 | -5.00 | 16.00 | 0.00 |
| NOISE FIGURE (DB) | | 0.30 | 1.00 | 2.00 | 5.50 | 5.50 | 5.00 | 5.50 | 0.00 |
| NOISE TEMP | 300 | 20.7 | 75.1 | 169.6 | 739.0 | 739.0 | 627.1 | 739.0 | 0.0 |
| CUM GAIN | | -0.3 | -1.00 | -3.00 | 13.00 | 29.00 | 24.00 | 40.00 | 40.00 |
| CUM NF | | 0.3 | 1.3 | 3.2 | 8.6 | 8.6 | 8.6 | 8.6 | 8.6 |
| CUM TEMP | 300.0 | 320.7 | 401.2 | 614.7 | 2089.2 | 2126.2 | 2127.0 | 2129.9 | 2129.9 |

MULTI-CHANNEL RADIOMETER IMAGING SYSTEM

RELATED APPLICATIONS

This application is a continuation of Ser. No. 10/995,952 filed Nov. 23, 2004, which is a continuation-in-part of Ser. No. 10/847,892 filed on May 18, 2004, which is based on provisional application Ser. No. 60/504.182 filed Sep. 18, 2003, the disclosures of which are hereby incorporated by reference in their entirety.

FIELD OF THE INVENTION

The present invention relates to the field of focal plane radiometers, and more particularly, the present invention relates to radiometer systems applicable for use at millimeter wave (MMW) frequencies.

BACKGROUND OF THE INVENTION

Since radio waves may be considered infrared radiation of long wave, a hot body would be expected to radiate microwave energy thermally. In order to be a good radiator of microwave energy, a body must be a good absorber. The best thermal radiator is a "black body." The amount of radiation emitted in the MMW range is $10^8$ times smaller than the amount emitted in the infrared range. Current MMW receivers, however, have at least $10^5$ times better noise performance than infrared detectors, and with some temperature contrast, the remaining $10^3$ may be recovered. This makes passive MMW imaging comparable in performance with current infrared systems. This unique characteristic makes MMW radiometers a popular choice for sensing thermal radiation. MMW radiometers have been used in many different applications such as remote terrestrial and extra-terrestrial sensing, medical diagnostics and defense applications. MMW electromagnetic radiation windows occur at 35 GHz, 94 GHz, 140 GHz and 220 GHz. The choice of frequency depends on specific applications.

Focal plane arrays are used to form images from radiation received by a reflector antenna. Millimeter wave (MMW) focal plane array radiometers also have been used in many applications to form images based on thermal sensing of radiated microwave energy. The sensitivity of existing radiometer designs, however, has been limited to about 1 deg K, resulting in poor images.

The principle of operation of the radiometric technique is fully described in the literature. The design of a typical radiometer is based on the technique of comparing the level of electromagnetic noise emitted by an unknown source to a reference or stable noise source. This technique and devices were initially proposed by Dicke [R. H. Dicke, "The Measurement of Thermal Radiation at Microwave Frequencies," The Review of Scientific Instruments, Vol. 17, No. 7, Jul. 1946].

In a Dicke radiometer circuit, the signals from an antenna are sampled and compared with signals from a reference source maintained at a known constant temperature. This overcomes some of the problems of amplifier instability, but in general does not alter effects resulting from imperfect components and thermal gradients.

While other types of radiometric devices have been used with some success, the Dicke (or comparison) type of radiometer has been the most widely used for the study of relatively low level noise-like MMW signals, especially where the noise signals to be examined are often small in comparison to the internally generated noise level within the radiometer receiver. While there are several types of comparison radiometers, one popular type of radiometer for use in the microwave/millimeter wave frequency bands is that in which an incoming signal to be measured and a standard or calibrated reference noise signal are compared. This type of radiometer consists essentially of the comparison of the amplitude of an unknown noise signal coming from the source to be examined with a known amplitude of a noise signal from a calibration source. This method has been found useful in measuring with considerable accuracy the effective temperature of an unknown source.

In the Dicke or comparison type radiometer, the receiver input is switched between the antenna and a local reference signal noise generator. The detected and amplified receiver output is coupled to a phase-sensing detector operated in synchronism with the input switching. The output signal from such a radiometer receiver is proportionate to the difference between the temperature of the reference signal source and the temperature of the source viewed by the antenna inasmuch as the phase-sensing detector acts to subtract the background or internal noise of the receiver.

A Dicke radiometer uses an RF switch coupled between an antenna and a radiometer receiver, allowing the receiver to alternate between the antenna and a known reference load termination. The receiver output is connected to a synchronous detector that produces an output voltage proportional to a difference between the antenna and the reference temperature. Null balance operation for the Dicke radiometer has been achieved by coupling in noise from a hot noise diode to the antenna port of the RF switch thereby enabling matching the temperature from standard reference loads.

The sensitivity of radiometer measurements are also often limited by random gain fluctuations in the RF front end, low frequency noise (1/f), and bias in the detector circuits. Over the last decades many special techniques, including Dicke switching, have been implemented to reduce measurement errors. Many of these proposals do not yield a true solution that will allow MMW radiometers to be commercially viable. In addition, the high cost of MMW RF receivers has limited the number of channels in the radiometer to a low number, resulting in a requirement to scan both azimuth and elevation to create an image.

The invention disclosed in the commonly assigned and incorporated by reference patent application Ser. No. 10/847,892 eliminates the need for a Dicke switch and does not use a synchronizing circuit because it uses the source and reference all the time, and runs the source and reference signal through the amplifiers. It used a balanced channel approach and MMIC chips. Thus, a radiometer channel can be implemented by the use of either a single millimeter wave monolithic integrated circuit (MMIC) or through discrete implementation using printed hybrids and multiple MMIC low noise amplifiers (LNA's).

This compact radiometer as disclosed can fit directly into the antenna focal plane. A quadrature hybrid network is used in the front end to distribute RF input signals and reference signals to a balanced amplifier chain, thereby reducing gain variations and improving radiometer sensitivity. A balanced detector diode circuit, for example, a pair of diodes in one non-limiting example, eliminates drift errors introduced by a detector diode as a function of temperature.

A video signal chopper amplifier circuit, also referred to by some as a auto zero amplifier, eliminates bias introduced by the video amplifier. A near perfect channel-to-channel matching exists through the use of quadrature hybrid network or through digital signal processing corrections. This hybrid radiometer provides improved sensitivity over the Dicke radiometer.

This radiometer system, however, requires processing of two channels, i.e., the antenna and reference, resulting in higher system complexity and cost. It would be advantageous to provide a radiometer design that could combine features of the different radiometers to achieve low system temperature and low implementation costs.

SUMMARY OF THE INVENTION

The radiometer of the present invention uses a combination of hybrid, low noise amplifiers (LNA's) and a switch to achieve low system temperature and low implementation cost. Unlike a typical Dicke radiometer where the switch losses translate directly into an increase in system noise, such as system temperature, the switch is positioned after a low noise amplifier. This design eliminates the impact of the switch losses. The radiometer of the present invention also combines the benefit of the low noise figure achieved by the hybrid approach and the simple, single channel processing achieved by the Dicke approach.

In accordance with the present invention, a radiometer system includes a hybrid and amplifier circuit that receives an unknown signal and known reference signal. A switch receives the unknown signal and known reference signal as inputs from the hybrid and amplifier circuit and switches between the signals. A detection circuit receives and detects a signal from the switch forming a detected signal. A controller circuit receives the detected signal and produces a digital output.

In one aspect of the present invention, the hybrid and amplifier circuit, the switch and the detection circuit comprise a radiometer front end. This radiometer can be sized and of such weight to fit directly into an antenna focal plane. The hybrid and amplifier circuit preferably is formed as printed hybrids and low noise amplifiers. The controller circuit is formed as an integrator circuit. The controller circuit can be formed as an analog-to-digital converter for converting the detected signals to digital signals. This controller circuit can also be formed as a processor that receives the digital signals from the analog-to-digital converter for further processing.

In yet another aspect of the present invention, the hybrid and amplifier circuit and switch are formed as a MMIC chip. The amplifier circuit receives a signal from the switch before the detection circuit. The amplifier circuit is also formed as a MMIC chip and is formed as two amplifier circuits and a filter circuit between the switch and detection circuit. Each amplifier circuit is also formed as a MMIC chip.

In yet another aspect of the present invention, the radiometer system includes an RF board having the hybrid and amplifier circuit, switch and detection circuit thereon. A controller board has the controller circuit and is operative with components on the RF board. A housing can carry the RF board and controller board. In one aspect of the present invention, the RF board is preferably formed from a soft board or ceramic material.

BRIEF DESCRIPTION OF THE DRAWINGS

Other objects, features and advantages of the present invention will become apparent from the detailed description of the invention which follows, when considered in light of the accompanying drawings in which:

FIG. 10 is a chart showing Dicke radiometer sensitivity of the type shown in FIG. 2.

FIG. 11 is a chart showing the radiometer sensitivity of the present invention.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

The present invention overcomes many existing shortcomings of current radiometers, including gain variation of the amplifiers, low frequency noise, detector bias, low sensitivity and high cost. The present invention reduces cost and size of a radiometer by a least a factor of ten and provides a commercial advantage over many current radiometers.

The low cost MMW radiometer of the present invention includes a housing section, a multi-channel RF board, and a controller board. The housing section is preferably made up of a base metal housing and a metallized plastic or metal cover that includes the RF launch opening, typically filled with a dielectric material, for example, a plastic material to allow for less than one wavelength spacing between the sensing radiators. The RF board preferably is formed from a single soft board or ceramic material. All MMW microstrip circuits, for example, 50 Ohm lines, filters, 90° hybrids and RF radiators, are printed on this board. MMIC amplifiers can be either attached directly to the board or, through cut-outs, on a carrier plate underneath to the RF board. A simple MMIC chip can also be used. A controller board, which uses a low cost microcontroller, performs any necessary video signal amplification, digitization and conditioning, automatic RF amplifier bias adjustment, and DC power regulation. The controller board interfaces with an external display system.

The compact radiometer of the present invention can fit directly in the antenna focal plane. A quadrature hybrid network is used in the front end to distribute RF input signals and reference signals to a balanced amplifier chain, thereby reducing gain variations and improving radiometer sensitivity. A balanced detector diode circuit, for example, a pair of diodes in one non-limiting example, eliminates drift errors introduced by a detector diode as a function of temperature.

A video signal chopper amplifier circuit, also referred to by some as a auto zero amplifier, eliminates bias introduced by the video amplifier. A near perfect channel-to-channel matching exists through the use of quadrature hybrid network or through digital signal processing corrections.

Figure 1:
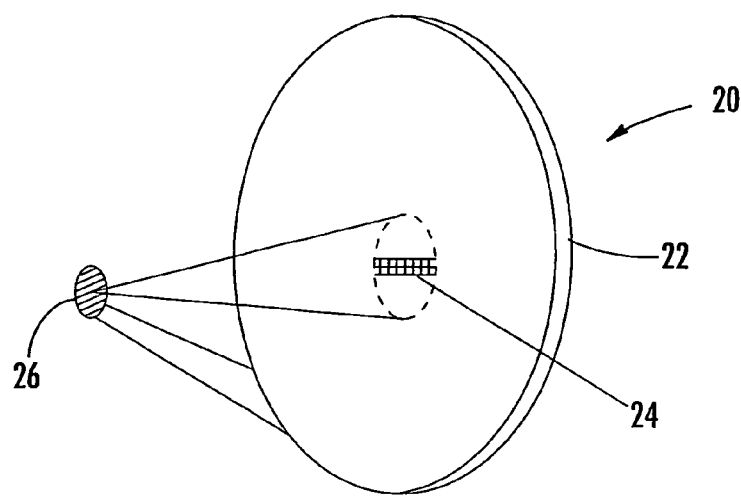
FIG. 1 is a fragmentary environmental view of a typical radiometer antenna system for a focal plane array.

FIG. 1 shows a typical radiometer antenna system 20. The main antenna 22 collects temperature data or other pertinent data to be analyzed. The data is focused in the middle of the antenna at the focal plane array 24 using a sub-reflector 26.

Figure 2:
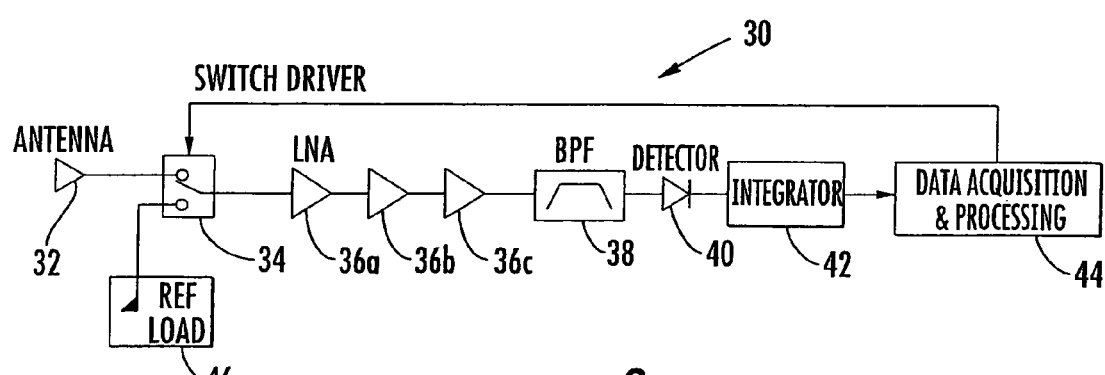
FIG. 2 is a block diagram showing a receiver front end in a typical radiometer system.

FIG. 2 shows a common prior art "Dicke" type radiometer system 30, including a receiver front end. In a Dicke radiometer, generally a receiving circuit detects weak signals in noise and modulates these signals at an input. The circuit demodulates the signals and compares the output with a reference from the modulator. Coincidence indicates a signal presence. For example, microwave noise power can be measured by comparing it with the noise from a standard source in a waveguide.

In this illustrated example of a Dicke radiometer, the antenna 32 senses target temperature, which is proportional to the radiated target energy. The energy passes through a Dicke switch 34 of the type known to those skilled in the art and into a series of MMIC amplifiers 36a, 36b, 36c. A band pass filter 38 sets the receiver bandwidth. A square law detector 40 detects the signal and passes it to an integrator 42, which sums the signal over an observation period. A data acquisition and processing circuit 44 receives the integrated signal, where it is digitized, compensated for gain variation, and processed for display on a video or for further processing. To cancel the effects of gain variation, the Dicke switch 34 samples a reference source 46. Gain variations in the receiver are cancelled using the measured reference gain.

Radiometer sensitivity is important. The precision in estimating the measured temperature is often referred to as the radiometer sensitivity, ΔT. This parameter is a key quantity characterizing the performance of a MMW radiometer. In radiometer terminology, this is the smallest change in temperature that can be detected by the radiometer. The equation, which derives the sensitivity of the system 30 shown in FIG. 2 is:

$$P_{sys} = P_A + P_{rec}$$

where $P_{sys}$=total input power
$P_A$=Noise power at the antenna=$k\,T_A\,B$
$P_{rec}$=Noise power generated in the receiver=$kT_{rec}B$
K=Boltzmann's constant
B=receiver bandwidth Assuming a square law detector, the radiometer output voltage is an average value of the radiometer output noise power. The square law detector can have an output proportional to the square of the applied voltage, e.g., the output is proportional to the square of the input amplitude. A radiometer output voltage is:

$$V_{out} = P_{sys} \times G_{sys}$$

where $G_{sys}$ is the receiver gain.

Assuming that $G_{sys}$ and $T_{rec}$ are constant, the radiometer sensitivity is:

$$\Delta T_{ideal} = (1/\sqrt{B\tau}) T_{sys}$$

where τ is the integration time.

In most applications, however, $G_{sys}$ and $T_{rec}$ are not constant, and their variations cause degradation of the radiometer sensitivity as follows:

Gain variations effects:

$$\Delta T_G = (T_A - T_{ref}) \times (\Delta G_{sys}/G_{sys})$$

Assuming a five degree difference between the antenna temperature and the reference temperature, a +/−3 dB gain variation (over the 3 LNA's 36a, 36b, 36c), and a 40 dB total system gain, the radiometer sensitivity will vary by about 5%.

Temperature variation effects can be shown:

$$\Delta T_{ant} = (T_A + T_{rec})/(\sqrt{B\tau/2}) = \sqrt{2}(T_A + T_{rec})/(\sqrt{B\tau})$$

$$\Delta T_{ref} = (T_{ref} + T_{rec})/(\sqrt{B\tau/2}) = \sqrt{2}(T_{ref} + T_{rec})/(\sqrt{B\tau})$$

Assuming statistical independence, the temperature variation can be shown:

$$\Delta T = [(\Delta T_G)^2 + (\Delta T_{ant})^2 + (\Delta T_{ref})^2]^{\frac{1}{2}}$$

$$= \left[\frac{2(T_A + T_{rec})^2 + 2(T_{ref} + T_{rec})^2}{(B\tau)^{\frac{1}{2}}} + (\Delta G_{sys}/G_{sys})^2(T_A - T_{ref})^2\right]^{\frac{1}{2}}$$

Assuming a balanced Dicke radiometer (i.e. $T_A = T_{ref}$), the above equation can be simplified to:

$$\Delta T = 2(T_A + T_{rec})/\sqrt{B\tau}$$

$$= 2\Delta T_{ideal}$$

Therefore, the Dicke radiometer sensitivity is twice that of an ideal total power radiometer. The factor of two (2) comes about because the Dicke switch alternates between the reference and the antenna such that TA is observed for only half of the time.

Figure 2A:
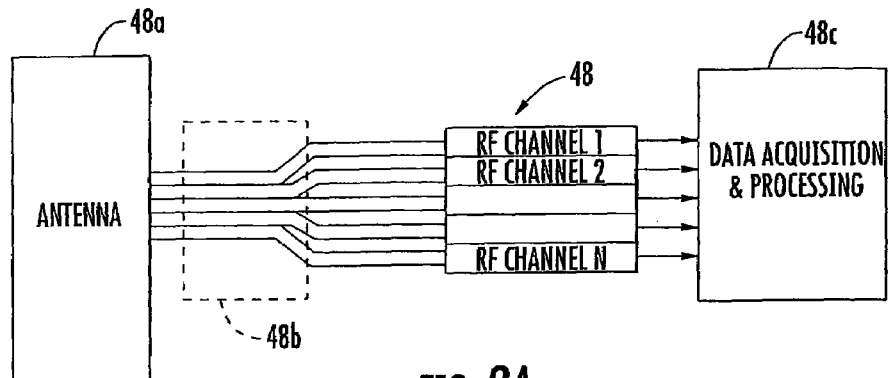
FIG. 2A is a block diagram showing how radiometer modules are typically connected to the antenna with a waveguide manifold in current art.

FIG. 2A shows how the radiometer channels 48, indicated as channels 1 . . . N, as part of RF modules, are typically connected to the antenna 48a. Because of the large size of the radiometer RF modules, which cannot fit directly in the antenna focal plane, a waveguide manifold 48b is used to connect the modules to the focal plane. The waveguide manifold 48b increases the front end losses by at least 2 dB, resulting in reduced radiometer sensitivity. The channels 48 connect to data acquisition and processing circuit 48c.

Figure 3:
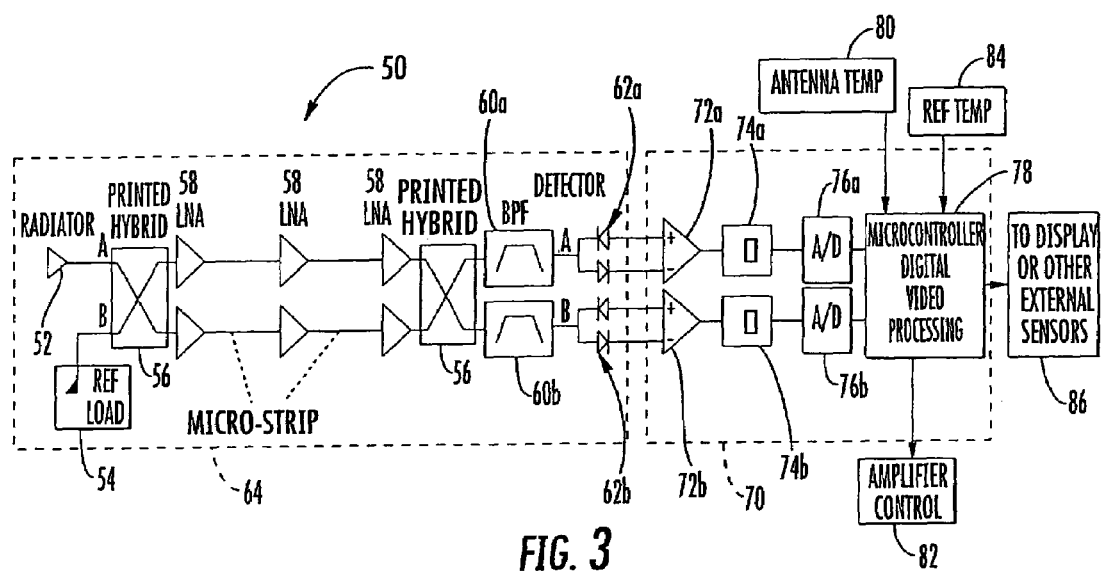
FIG. 3 is a block diagram illustrating the basic functional components of the radiometer of the present invention.

FIG. 3 is a block diagram of the radiometer 50 of the present invention. This radiometer design does not use a Dicke switch, yet it still delivers superior sensitivity and can be readily manufactured.

A radiator 52 provides a first signal input A while a reference 54 provides a second signal input B. The radiator 52 could be many types of radiator elements used in radiometers, including an antenna. Microstrip quadrature hybrid circuits 56 are operable with low noise amplifier circuits 58. The hybrid circuits can be 90° hybrids. Bandpass filter circuits 60a, 60b receive the signals represented at A and B, which are output to detector circuits 62a, 62b. These components are typically mounted on an RF board indicated by the dashed lines at 64. The RF board is typically formed from a single soft board or ceramic material. All MMW microstrip circuits, for example, 50 ohm lines, filters, hybrids and RF radiators, are printed on this board. Any MMIC amplifiers can be attached directly to the board, or through cut-outs, on a carrier plate underneath to the RF board.

The signals (A and B) are output to a controller board indicated by dashed lines at 70. On this board, any necessary video signal amplification, digitization and conditioning, automatic RF amplifier bias adjustment, and DC power regulation occurs. This board can interface directly with a video display system. The signal is received at two chopper amplifier circuits 72a, 72b. After amplification, the signals are integrated at integrator circuits 74a, 74b, and digitized at analog/digital (A/D) circuits 76a, 76b. A microcontroller circuit 78 provides digital video processing and receives an antenna temperature signal 80, amplifier control signal 82, and reference temperature signal 84. The output from the microcontroller circuit 78 is sent to a display or other external sensors 86.

The radiometer 50 of the present invention uses microstrip quadrature hybrids 56 to distribute the signal and reference powers to the balanced amplifier chain as illustrated. The pairs of low noise amplifiers (LNA's) 58 are cross-coupled to each other, similar to a conventional balanced amplifier configuration.

Figure 3A:
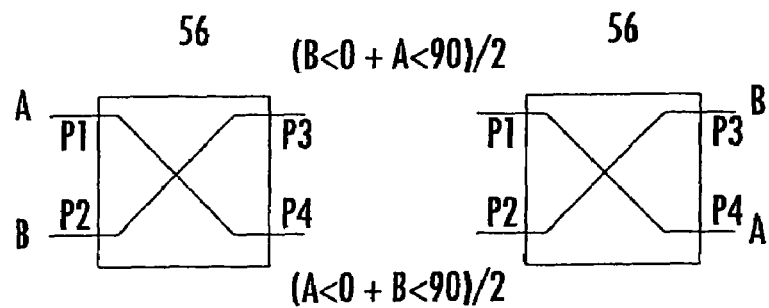
FIG. 3A is a block diagram of the quadrature hybrid used in the radiometer of FIG. 3 showing how inputs A, B are divided equally in the first hybrid, then reconstructed in the second hybrid.

The quadrature hybrid shown in FIG. 3A is a well known four-port device that splits the energy into equal parts at the output, but with a 90 degree phase difference. For example, the signal A at the input port P1 of the hybrid is divided up to two parts at the output ports P3 and P4. The same is true for the input signal B at the input port P2 of the hybrid, which is also divided equally at the output ports P3 and P4. When the output of the first hybrid is used as input into a second hybrid, the signals A and B are restored at the output of the second hybrid (of course with some losses due to the hybrids). The two inputs A and B, which can represent the antenna port and the reference port, or represent two antenna ports representing two different polarizations, are divided equally among the amplifiers and reconstructed at the output, as shown in FIG. 3A. One other unique feature of this hybrid design is that failure of one or more of the LNA's 58 in the chain does not result in failure of the channel itself. Because of the distributed gain approach, the gain of the channel will drop by a small amount, which can be accounted for in the microcontroller 78. This is different from the traditional radiometer shown in FIG. 2, where failure of one LNA will result in total failure of the element.

Because each signal passes through each amplifier in the chain, any fluctuation in the gain of any of the amplifiers is applied equally to both signals ($T_A$ & $T_{Ref}$) Assuming that the hybrid circuits 56 are well balanced by using good design practices, this radiometer design guarantees that the gain in each channel is substantially the same. In addition, because the gain in each channel is essentially the average of that of all the amplifiers in the chain, the overall gain fluctuation is effectively reduced by a factor of the square root of N, where N is the number of amplifiers.

$$\Delta G_{sys} = \left[ (1/N) \sum_{I=1}^{N} (\Delta G_i)^2 \right]^{\frac{1}{2}}$$

Assuming the same amount of the LNA's gain variation (+/−3 dB) used for the Dicke radiometer as shown in FIG. 2, the radiometer system gain variation of the present invention will be only about +/−0.7 dB. Therefore, it is evident that the radiometer of the present invention provides the inherent benefits of receiver gain fluctuation reduction and guarantees equal gain for both the antenna power and the reference signal. This feature provides the same benefit as the Dicke switch without the added losses and the complex switching circuitry. Also, the absence the Dicke switch in the present invention allows continuous observation of the antenna temperature, thereby achieving the sensitivity of a total power radiometer.

$\Delta T_{ideal} = (1/\sqrt{B\tau}) T_{sys}$

Using commercially available W-band LNA's with over 20 GHz bandwidth, such as an ALH394 circuit made by Velocium of Redondo Beach, Calif., and assuming an integration time of 20 msec and 1200 K total system temperature, this radiometer sensitivity is less than 0.1 degree. The ALH394 is a broadband, three-stage, low noise monolithic HEMT amplifier. It has a small die size and is passivated. Bond pad and backside metallization can be Ti/Au and compatible with conventional die attach, thermocompression and thermosonic wire bonding assembly. It can have a usable radio frequency of 76 to about 96 GHz, linear gain of about 17 dB, and a noise figure of about 5 dB depending on applications. It can use DC power of about 2 volts at 34 mA. Bond pads can include VG1, VG2 and VG3, VD1, VD2, VD3, with an RF in and RF out pad.

The RF signals at the output of the band pass filter 60a, 60b are detected using the square law detector 62a, 62b. In order to eliminate any detector variation over temperature, a pair of balanced diodes 62a, 62b, such as a DBES105a diode manufactured by United Monolithic Semiconductors, can be used. This dual Schottky diode is based on a low cost 1 μm stepper process with bump technology and reduced parasitic conductances and having a high operating frequency. It can be a flip-chip dual diode with high cut-off frequencies of about 3 THz and a breakdown voltage of less than −5 volts at 20 uA. It has a substantially adequate ideality factor of about 1.2.

The diodes output an equal amount of power, but with opposite polarity. This method effectively cancels any bias or drift caused by the diodes. The very small DC voltages at the output of the diodes are typically very difficult to amplify accurately. DC offsets introduced by the op-amps are usually a cause of the problem, aggravated often by low frequency noise (1/f). The radiometer 50 of the present invention uses chopping op-amp circuits 72*a*, 72*b*, also known as auto zero amplifiers, such as the AD8628 amplifier manufactured by Analog Devices. This amplifier circuit eliminates DC offset and low frequency (1/f) noise.

The AD8628 amplifier has ultra-low offset, drift and bias current. It is a wide bandwidth auto-zero amplifier featuring rail-to-rail input and output swings and low noise. Operation is specified from 2.7 to 5 volts single supply (1.35V to 2.5V dual supply). It has low cost with high accuracy and low noise and external capacitors are not required. It reduces the digital switching noise found in most chopper stabilized amplifiers, and has an offset voltage of 1 µV, a drift less than 0.005 µV/° C., and noise of 0.5 uV P—P (0 Hz to 10 Hz). This amplifier is available in a tiny SOT23 and 8-pin narrow SOIC plastic packages.

An offset voltage of less than 1 µV allows this amplifier to be configured for high gains without risk of excessive output voltage errors. The small temperature drift of 2 nV/° C. ensures a minimum of offset voltage error over its entire temperature range of −40° C. to +125° C. It has high precision through auto-zeroing and chopping. This amplifier uses both auto-zeroing and chopping in a ping-pong arrangement to obtain lower low frequency noise and lower energy at the chopping and auto-zeroing frequencies. This maximizes the signal-to-noise radio (SNR) without additional filtering. The clock frequency of 15 kHz simplifies filter requirements for a wide, useful, noise-free bandwidth. The amplifier is preferably packaged in a 5-lead TSOT-23 package.

1/f noise, also known as pink noise, is a major contributor of errors in decoupled measurements. This 1/f noise error term can be in the range of several µV or more, and when amplified with the closed-loop gain of the circuit, can show up as a large output offset. 1/f noise is eliminated internally. 1/f noise appears as a slowly varying offset to inputs. Auto-zeroing corrects any DC or low frequency offset, thus the 1/f noise component is essentially removed leaving the amplifier free of 1/f noise.

The output of the integrator circuits 74*a*, 74*b* for both the antenna signal and the reference signals are digitized using highly linear A/D circuits 76*a*, 76*b* and are sent to the microcontroller 78, where the reference signal is subtracted from the antenna signal to obtain the actual target temperature. The microcontroller 78 can monitor the temperature of the antenna through a sensor attached to the antenna. Any differences between the antenna and the reference are accounted for and corrections are applied appropriately in software. The microcontroller 78 also controls the LNA bias and monitors the amount of current drawn by each amplifier and adjusts the amplifier gain.

Figure 3B:
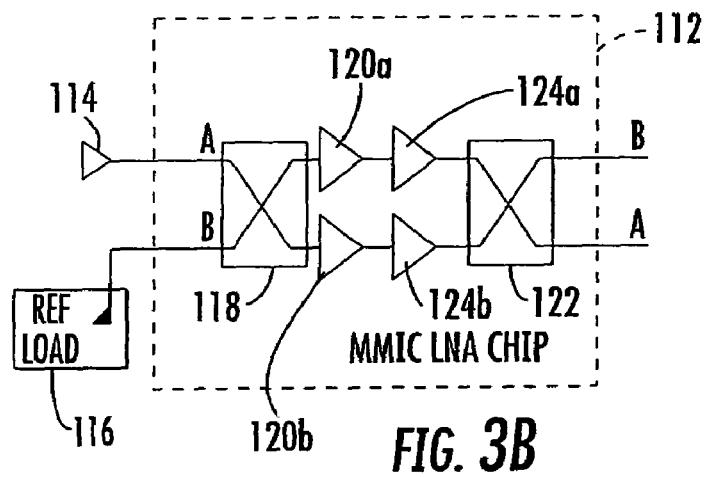
FIG. 3B is a block diagram showing a two-stage MMIC LNA chip of the present invention as a representative example.

FIG. 3B shows a two-stage MMIC chip 112 that can be used in the present invention to replace the discrete implementation of the hybrid and cascade LNA's shown in FIG. 3. This MMIC LNA chip receives a signal from the antennp 114 or reference load 116 that enters through signal inputs A and B into the hybrid circuit 118 and into amplifiers 120*a*. 120*b* through amplifiers 124*a*, 124*b*, through hybrid 122 to be output as signals A and B amplified.

Figure 3C:
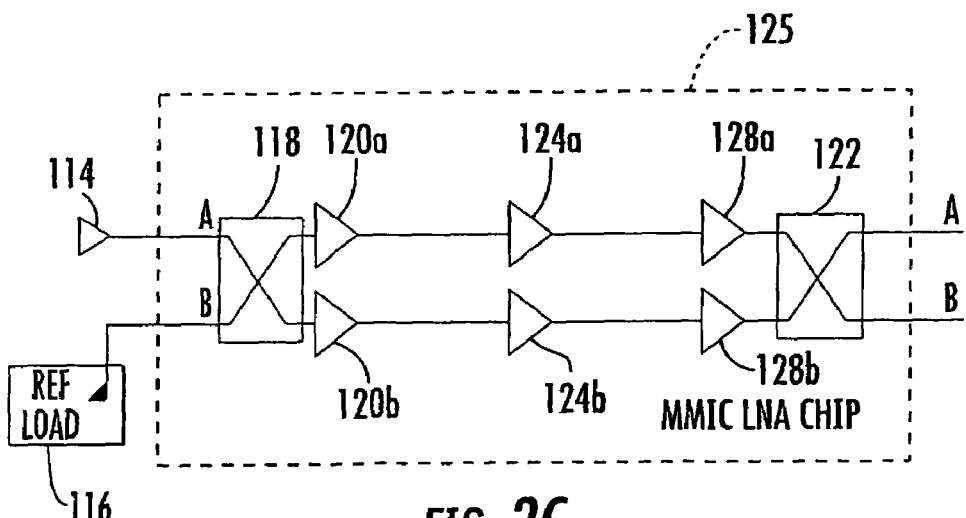
FIG. 3C is a block diagram showing a three-stage MMIC LNA chip of the present invention.

FIG. 3C is a block diagram showing a three-stage MMIC LNA chip implementation 125 with respective amplifier circuits 128*a* and 128*b*.

Thus, the balanced channel approach of the present invention can use MMIC chips and the implementation of a radiometer channel can occur either by the use of a single millimeter wave monolithic integrated circuit (MMIC) or through discrete implementation using printed hybrids and multiple MMIC LNA'S.

Figure 3D:
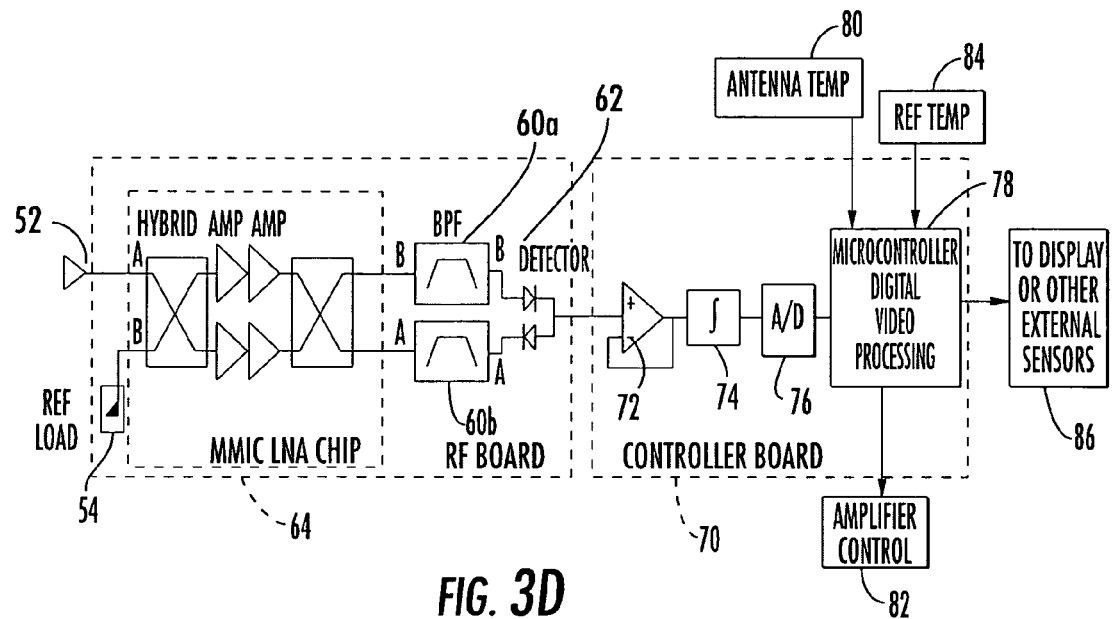
FIG. 3D is a block diagram illustrating the basic functional components of the radiometer of the present invention using the MMIC chip of FIG. 3B.

FIG. 3D is a block diagram of the radiometer 50 of the present invention. This radiometer design uses the MMIC chip 112 shown in FIG. 3B to replace the printed hybrids and individual LNA chips. This figure shows yet another example of how this invention can be used to build radiometer channels. Only one detector 62 as a pair of diodes is used. One chopper 72 amplifier and any integrator 74 and A/D circuit 76.

Figure 4:
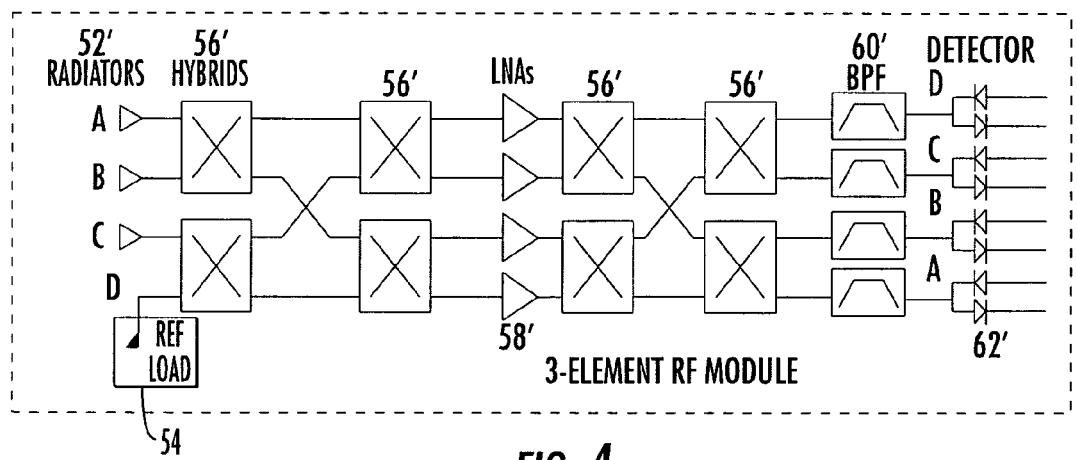
FIG. 4 is a block diagram showing functional components of another example of a multi-channel radiometer of the present invention.

The radiometer of the present invention can also be manufactured in an arrangement having a larger number of channels, such as shown in FIG. 4. Prime notation is used to show the various radiators 52', hybrid circuits 56', and low noise amplifiers 58'. As illustrated, signals A, B and C are generated from radiators 52' and a reference signal is generated from the reference 54'. Two parallel hybrid circuits 56' are illustrated at the front end and input into four parallel, low noise amplifier circuits 58' instead of two as shown in FIG. 3. This follows by other parallel hybrid circuits 56' and low noise amplifier circuits 58'. Four bandpass filters 60' are illustrated with detector circuit 62' forming a three-element radio frequency module.

Figure 5:
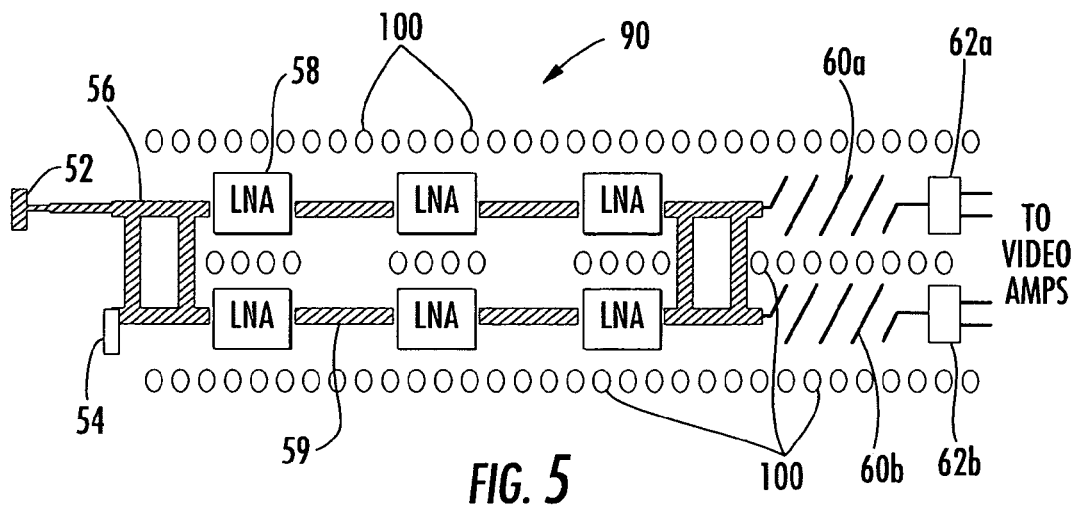
FIG. 5 is a block diagram showing the layout for the RF front end in the radiometer of the present invention.

FIG. 5 shows an example of a layout for the RF front end used in the radiometer 50 of the present invention, forming a radiometer cell 90. The radiator elements 52, the quadrature hybrids 56, 50 ohm microstrip lines 59 and the filters 60*a*, 60*b* are all printed on a soft board or a ceramic board. Isolation vias 100 are used to isolate the amplifiers 58 and reduces the likelihood of oscillations.

Figure 6:
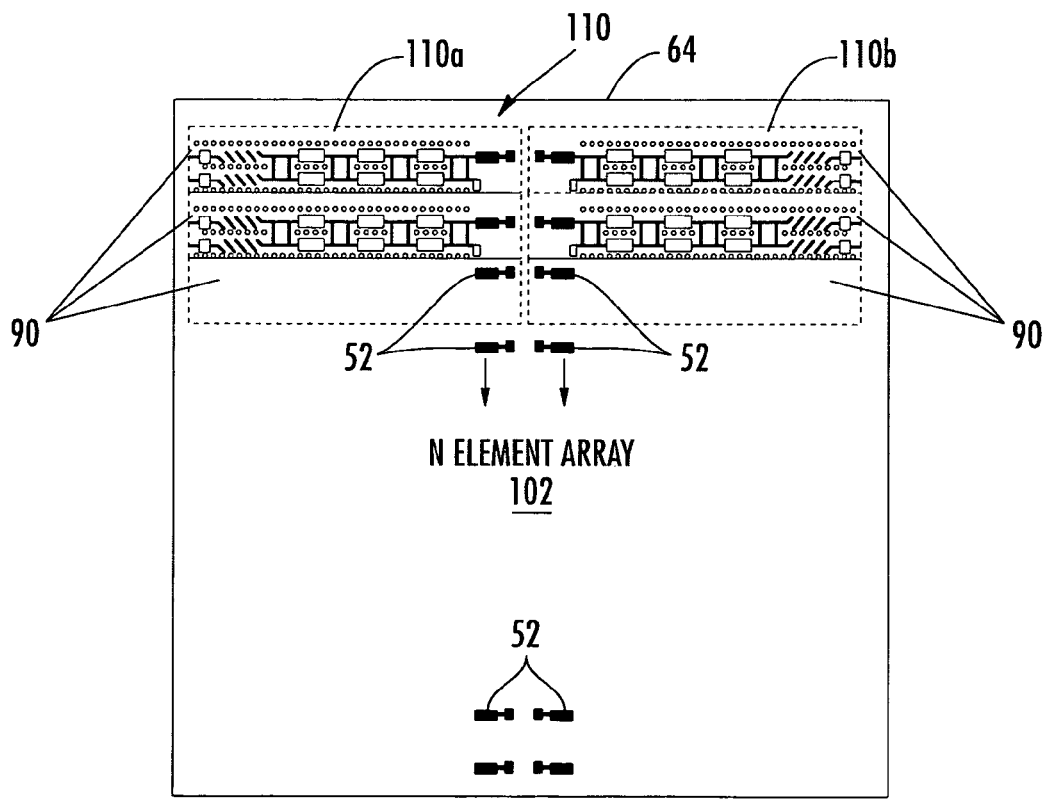
FIG. 6 is a plan view showing a multi-channel radiometer layout on a single RF board.

FIG. 6 shows a multi-channel radiometer layout on a single RF board. A plurality of radiometer cells 90 are illustrated, forming a N element array 102 with channels 110. Radiators 52 are also illustrated. This design approach allows for low cost implementation of a large number of channels. The radiator elements 52 can be spaced half a wavelength (λ/2) apart for lower cross coupling, lower sidelobes and overall improved operations. The channels 110 are stacked on both sides of the board in order to achieve two rows 1110*a*, 10*b* of radiometer cells 90 in a very small amount of space. For dual polarization applications, one row 110*a* may be vertically polarized while the second row 10*b* could be horizontally polarized. The radiators, for example as antenna elements, can be alternated between vertical and horizontal polarization in the same row. For example, a 32×2 array can easily fit a 3×4 inch RF board. This board can become part of a radiometer module of the present invention.

Figure 7:
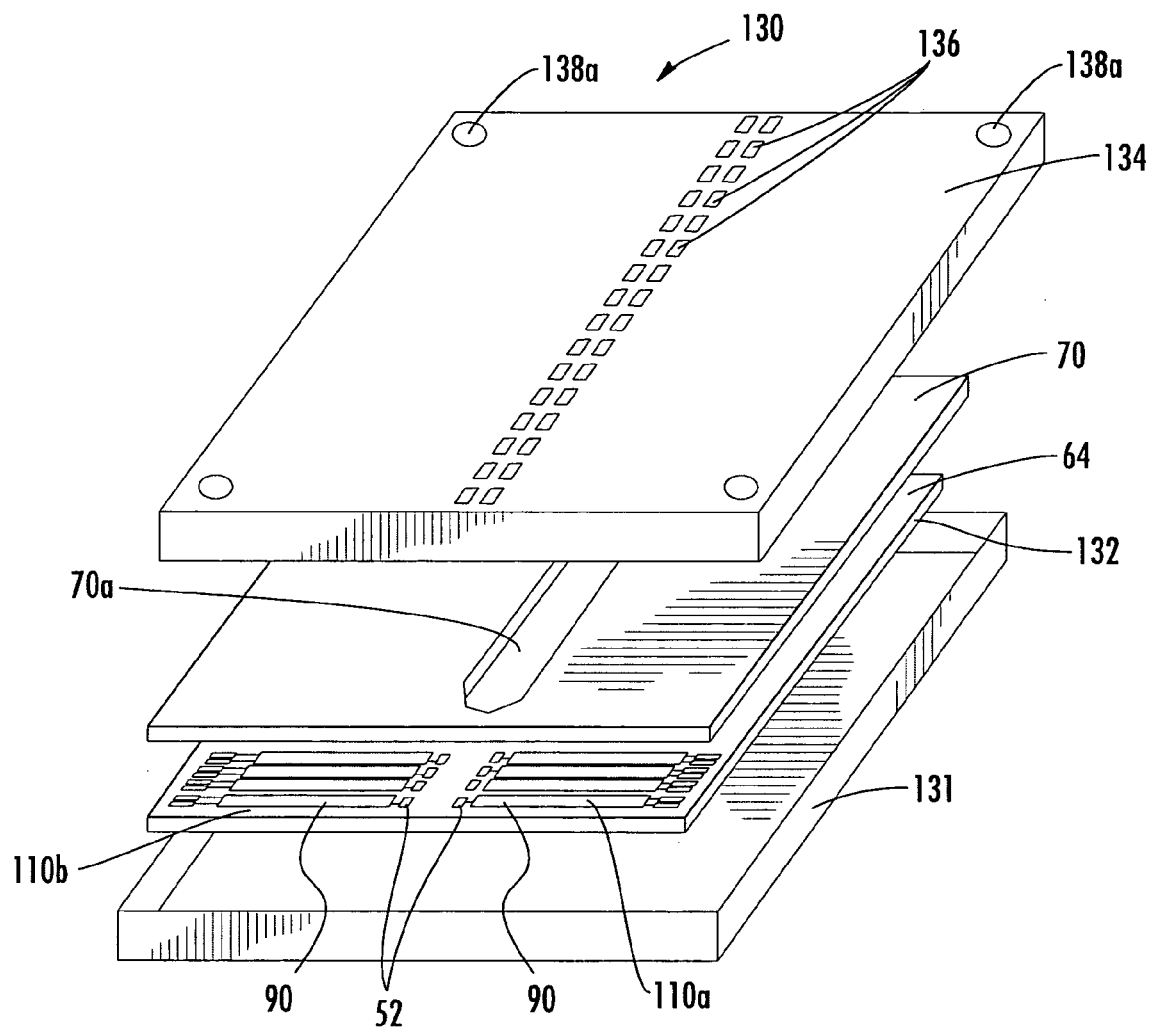
FIG. 7 is an exploded isometric view of a compact multi-channel radiometer module showing a base housing, RF board, controller board and top cover.

FIG. 7 shows an exploded view of a compact, multi-channel radiometer module 130 of the present invention. A base housing 131, typically made-up of aluminum, is used to receive the RF board 64, which can be attached to a CTE matched carrier 132. The controller board 70, which supplies all the DC voltages and control signals, makes contact with the RF board 64 through the use of DC contact connectors. The top cover 134, which can be made from a plastic material, is metallized everywhere except where the radiator areas 136 correspond to the location of the radiators. These unmetallized radiator areas 136 provide a dielectric media for the RF energy to travel through. Thus, RF launch openings are formed. A slot 70a in the controller board provides access to the antenna elements. The entire unit is assembled using fasteners, such as screws received in fastener apertures 138a.

Figure 8:
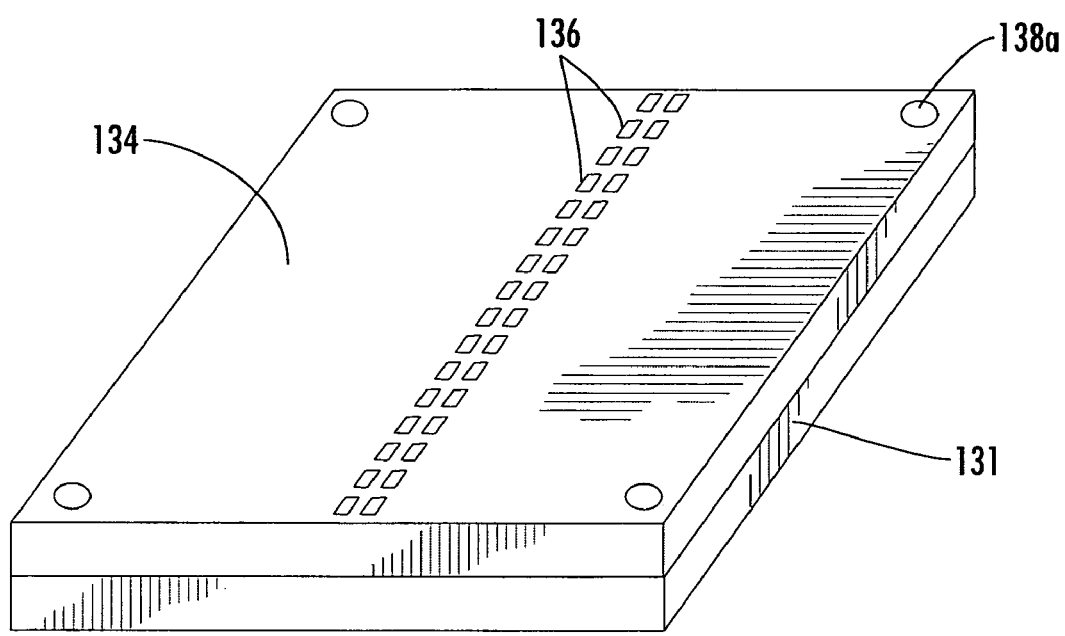
FIG. 8 is an isometric view of the assembled multi-channel radiometer module of the present invention.

FIG. 8 shows fully assembled multi-channel radiometer module of the present invention forming a radiometer module or "sensor package" as illustrated.

Figure 9:
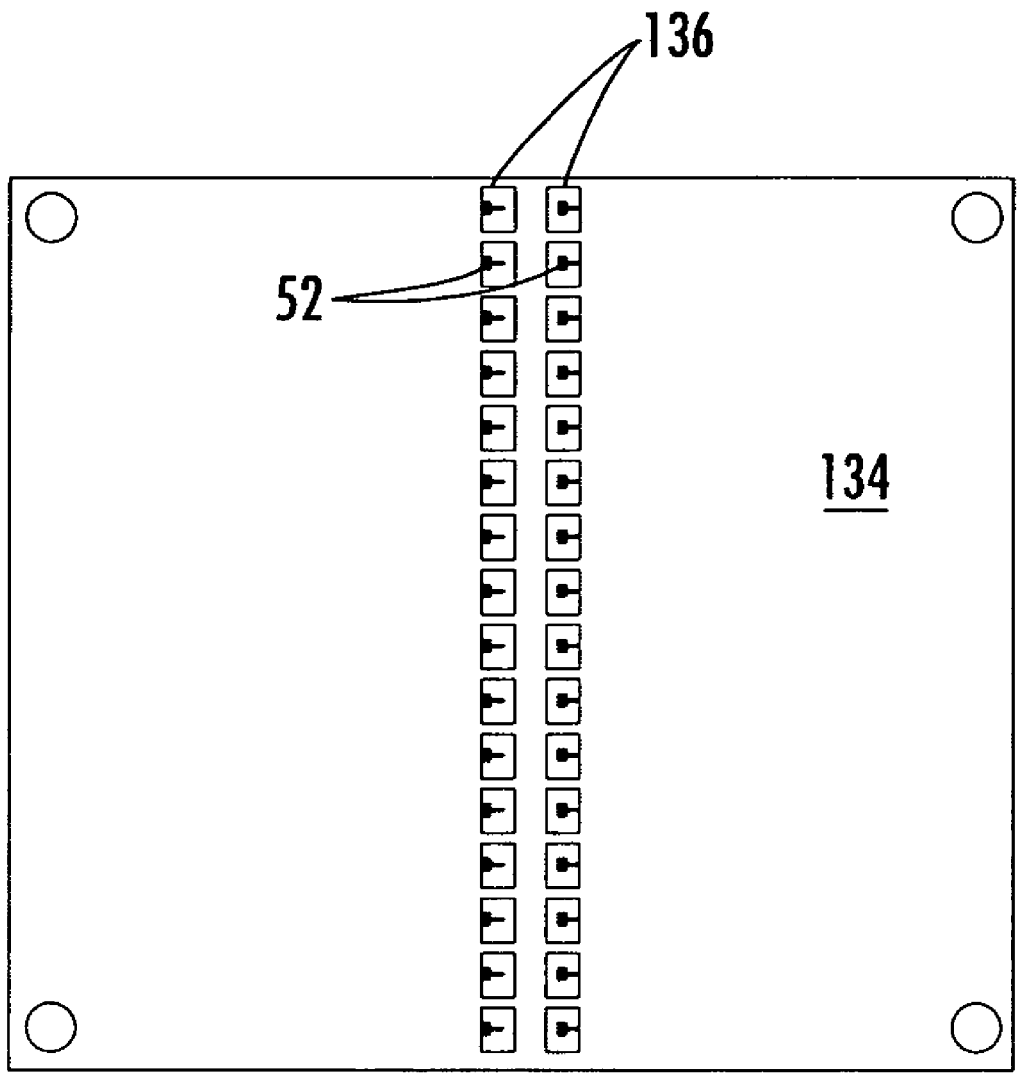
FIG. 9 is a top plan view of the multi-channel millimeter wave radiometer module shown in FIG. 8.

FIG. 9 is a top plan view of the multi-channel millimeter wave radiometer module shown in FIG. 8 and showing the radiator areas 136 and radiators. FIGS. 10 and 11 show various components of a Dicke radiometer (FIG. 10) and showing the Dicke radiometer sensitivity as compared to the radiometer sensitivity of the present invention as shown in FIG. 11. The different components of the radiometers and the relative sensitivity and operating or reference values are shown under the specific elements as illustrated.

The radiometer module of the present invention has at least six times higher sensitivity than more current radiometer sensitivity, such as the Dicke radiometer sensitivity explained above with reference to FIG. 2 and shown in FIG. 10. The present invention is advantageous and provides a radiometer with the sensitivity of less than 1° K. The radiometer module (sensor) is at least ten times smaller than other radiometers currently in use. The radiometer of the present invention also is at least ten times lighter in weight than any other radiometer in existence, which typically weighs no less than 20 pounds. The radiometer of the present invention is typically less than about three pounds.

The present invention also is self-correcting for temperature and gain variations. It uses the balanced pair of diodes for detection and the chopper operational amplifiers to eliminate any bias and reduce 1/F noise. The microcontroller can monitor temperature changes between the antenna and the reference by reading any temperature sensors located on the antenna and near the reference. This can be based on temperatures to adjust the correction factor. The gain can be continuously monitored and the bias adjusted of the low noise amplifier (LNA) to maintain the constant gain. Real-time corrections can be performed on all video channels to account for any changes in temperature or gain.

The radiometer of the present invention also has self-healing capability because of the distributed gain approach. Failure of one or more LNA's in each channel will not result in failure of the channel. The microcontroller can compensate for the drop of any amplifiers in the chain.

Figures 12, 13:
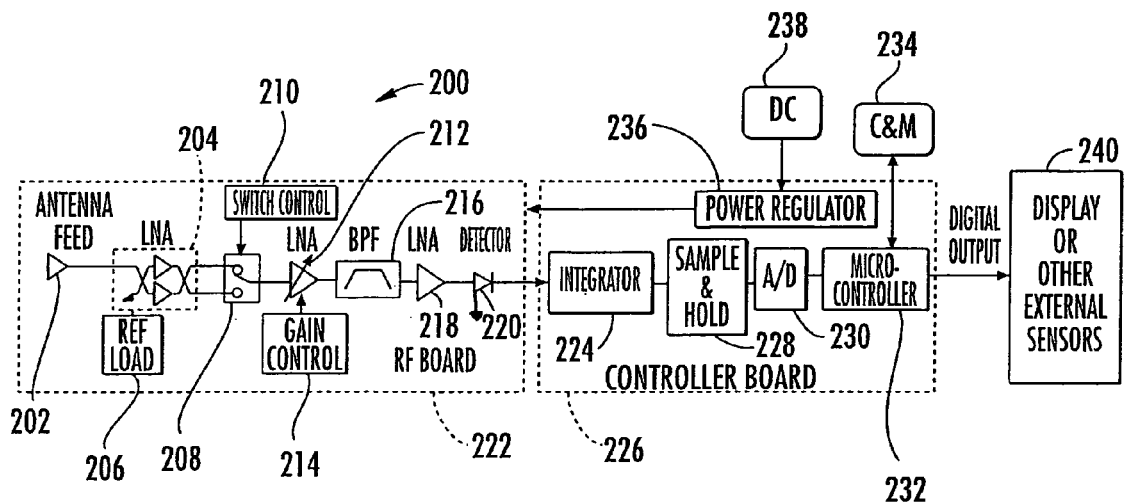
FIG. 12 is a block diagram illustrating basic functional components of the radiometer system of the present invention and showing a hybrid low noise amplifier followed by the switch.
FIG. 13 is a chart showing a Dicke radiometer system and noise performance of the different components.

FIG. 12 is a block diagram of a radiometer system 200 of the present invention using a combination of hybrid low noise amplifiers and a switch to achieve low system temperature and low implementation cost. Unlike a typical Dicke radiometer where the switch losses translate directly into an increase in system noise figures, and system temperature. Moving the switch after a first low noise amplifier circuit as illustrated in FIG. 12 nearly eliminates the impact of the switch losses. The radiometer system of the present invention combines the benefit of the low noise figure achieved by the hybrid approach and a simple, single channel processing achieved by the Dicke approach.

FIG. 12 shows an antenna feed 202 operatively connected to the low noise amplifier circuit 204, which receives antenna signal and the reference signal from the reference load 206. The low noise amplifier circuit 204 is cross-coupled and quadrature and has signal outputs received at the switch 208 that also receives a signal from a switch control 210. This circuit could be a microcontroller or other processor as part of or controlled from the controller board. The switch 208 is operatively connected to an adjustable low noise amplifier 212, which receives a gain control signal from gain control circuit 214. The output signal enters a band pass filter 216, low noise amplifier circuit 218 and detector circuit 220, all of the type that could be used as described for the embodiment shown in FIG. 3 or other embodiments as non-limiting examples. The components as described are contained on an RF board 222 shown by the dashed line.

The detected signal from the detector circuit 220 passes into an integrator circuit 224 that is positioned on the controller board 226 and into a sample and hold circuit 228. The analog signal is then converted into a digital signal by an appropriate analog/digital converter 230 and received in a microcontroller 232 which is operative with a C&M circuit 234. A power regulation circuit 236 receives DC signals from a DC source 238 and regulates the RF board 222 and controller board 226. The microcontroller 232 can output a digital signal to a display or other external sensors 240 as described before. It should be understood that the term microcontroller in this description encompasses many different types of controllers and processors.

Figure 14:
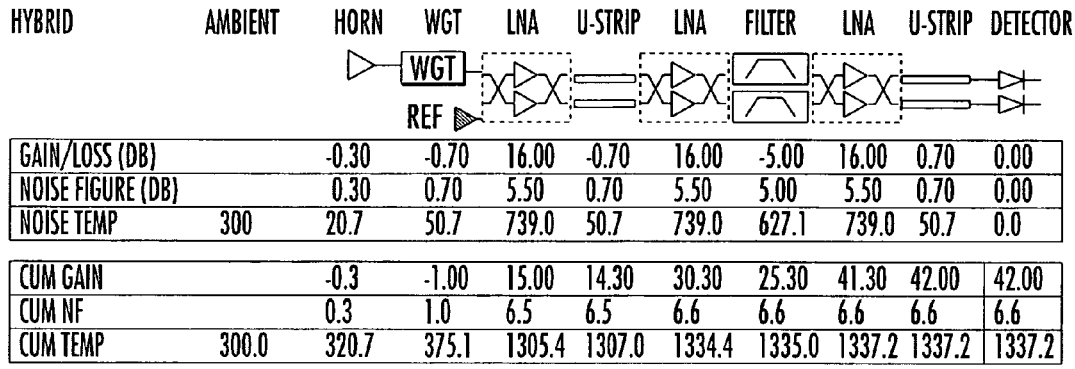
FIG. 14 is a chart showing radiometer system noise performance of a hybrid radiometer system.
Figure 15:
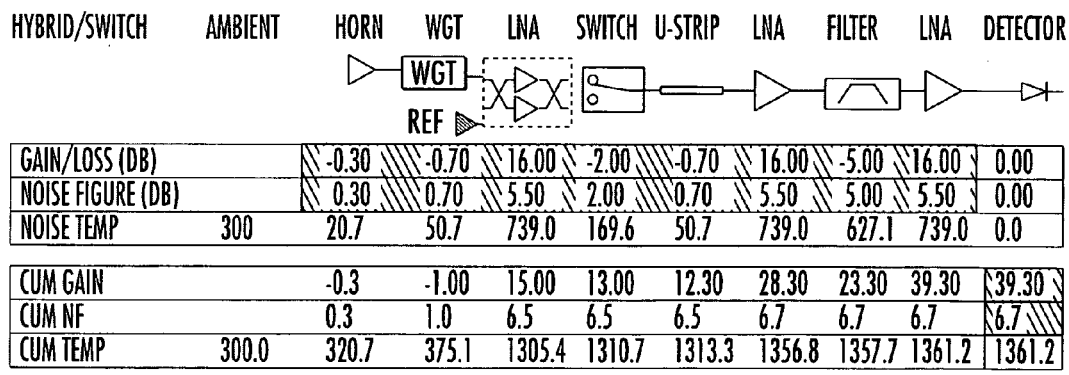
FIG. 15 is a chart showing the radiometer system noise performance for a hybrid/switch radiometer of the present invention.

FIGS. 13, 14 and 15 show respective comparison of the resulting system noise performance from a traditional Dicke radiometer and the hybrid and the hybrid/switch of the present invention. The left hand side of the chart shows the gain/loss in decibels, followed by the noise figure in decibels, the noise temperature in degrees Kelvin, the cumulative gain, the cumulative NF, and the cumulative temperature. Each of the functional blocks of the radiometer is illustrated with corresponding results listed under that corresponding functional block. For example, FIG. 13 shows the ambient temperature and the various results at the horn, the waveguide transition (WGT), the switch, the two low noise amplifiers, the band pass filter, the low noise amplifier and the detector.

FIG. 14 shows the results for the hybrid circuit described before, such as with FIG. 3, with the ambient temperature and the horn, the waveguide transition, the low noise amplifier, microstrip, low noise amplifier, band pass filter, low noise amplifier microstrip and detector.

FIG. 15 shows the results for the hybrid and switch combination of the present invention, showing the ambient temperature, and the functional blocks of the horn, waveguide transition, the low noise amplifier that receives the reference signal, the switch, the microstrip, the low noise amplifier, the band pass filter, the low noise amplifier and detector circuit.

These results show the system temperature in degrees Kelvin (K) for the three configurations corresponding to the Dicke, hybrid and hybrid/switch. The Dicke radiometer in the example as shown in FIG. 13 results in 2129.9 degrees K system temperature. The hybrid radiometer results in 1337.2 degrees K system temperature. The hybrid/switch radiometer of the present invention results in 1361.2 degrees K. Thus, the hybrid/switch system of the present invention results in only a 24 degree K increase in system temperature over the hybrid approach, but benefits from the single channel process and simplicity of the Dicke radiometer.

Figure 16:
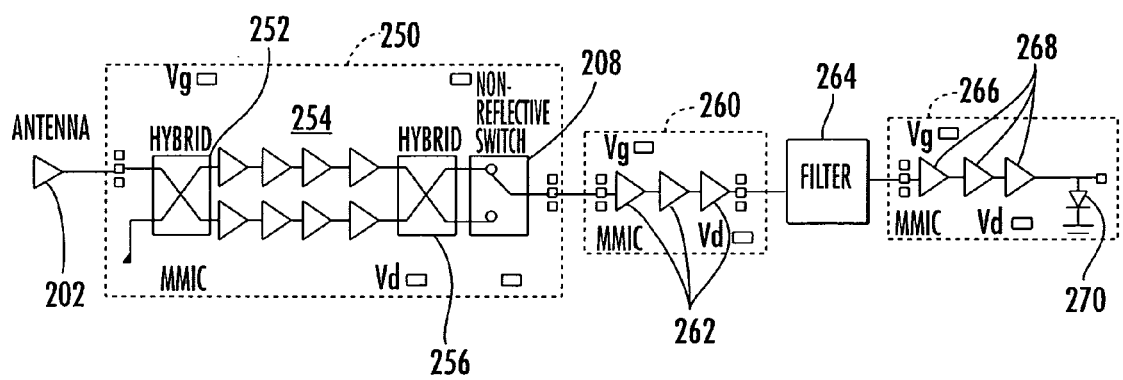
FIG. 16 is a block diagram of a hybrid/switch low noise amplifier radiometer of the present invention showing its use of MMIC chips.

FIG. 16 is another block diagram of the radiometer of the present invention showing how different MMIC chips can be implemented in the combined hybrid/switch radiometer front end of the present invention. As illustrated, signals from the antenna 202 are received in the first MMIC chip 250, which includes a hybrid 252, amplifiers 254, hybrid 256 and non-reflective switch 208. A second MMIC 260 chip includes amplifiers 262. This is followed by a filter 264 and a third MMIC chip 266 with appropriate amplifiers 268 and detector 270. The first MMIC chip 250 combines the hybrid LNA (approximately 20 decibel gain and less than 4 dB NF) configuration with a non-reflective switch 208 of less than about 1.5 dB. The second LNA chip 260 can be a single channel amplifier of about 16 DB gain which provides the capability of adjusting gain by changing the gate bias (Vg). The third MMIC chip 266 combines a single channel low noise amplifier with a detector diode 270.

It is evident that the radiometer of the present invention enhances performance and reduces complexity. The radiometer includes the benefits of the hybrid radiometer performance with the simplicity of single channel processing provided in the Dicke radiometer. A MMIC chip implementation is provided that simplifies the RF front end implementation. One MMIC chip combines the LNA hybrid function with a non-reflective switch and the second LNA is a simple single channel amplifier. The third LNA combines the amplifier function with a zero bias detector diode to provide a low cost, high performance radiometer.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

The invention claimed is:

1. A MMIC comprising:
    a hybrid and amplifier circuit that is adapted to receive an unknown signal and known reference signal and comprising a first quadrature hybrid as an input having at least one radio frequency (RF) input and parallel signal path outputs;
    at least one amplifier connected to each signal path output of the first quadrature hybrid;
    a second quadrature hybrid connected to the at least one amplifier at each signal path and having parallel RF outputs, wherein the amplifiers provide equalized amplifier gain;
    a switch positioned after the dual channel quadrature hybrid network and operatively connected to the parallel RF outputs of the second quadrature hybrid for selecting one of the RF outputs and providing a single RF output; and
    a detector operatively connected to the switch for detecting the single RF output from the switch.

2. A MMIC according to claim 1, wherein said switch comprises a non-reflective switch.

3. A MMIC according to claim 1, wherein said switch is operative for minimizing any amplifier noise.

4. A MMIC according to claim 1, wherein said detector comprises a diode.

5. A MMIC according to claim 1, wherein said detector is ground connected.

6. A MMIC according to claim 1, and further comprising dual RF inputs and RF outputs.

* * * * *